United States Patent [19]
Powell et al.

[11] Patent Number: 5,323,119
[45] Date of Patent: Jun. 21, 1994

[54] AMPLIFIER HAVING FEED FORWARD CANCELLATION

[75] Inventors: Jack Powell, Cestas, France; Thomas Ha, Gardena, Calif.; Georg Luettgenau, Madrid, Spain

[73] Assignee: Motorola, Inc., Schaumburg, Ill.

[21] Appl. No.: 690,927

[22] PCT Filed: Nov. 12, 1990

[86] PCT No.: PCT/EP90/01890
§ 371 Date: Jul. 14, 1991
§ 102(e) Date: Jul. 14, 1991

[87] PCT Pub. No.: WO91/07812
PCT Pub. Date: May 30, 1991

[30] Foreign Application Priority Data
Nov. 16, 1989 [GB] United Kingdom ............... 8925959

[51] Int. Cl.$^5$ ............................................. H03F 1/26
[52] U.S. Cl. ................................................... 330/151
[58] Field of Search ........................... 330/52, 149, 151

[56] References Cited
U.S. PATENT DOCUMENTS
3,922,617 11/1975 Denniston et al. ............. 330/151 X
4,885,551 12/1989 Myer ................................ 330/151 X Primary Examiner—James B. Mullins
Attorney, Agent, or Firm—Joe E. Barbee; Bradley J. Botsch, Sr.

[57] ABSTRACT

The present invention provides an amplifier arrangement to which feed forward correction is applied by a comparison loop including comparison means for comparing amplifier input with amplifier output to provide an error signal, a cancellation loop including secondary amplifier means for amplifying the error signal and combining means for combining said amplified signal with said amplifier output, a pilot generator coupled to said amplifier input to introduce a pilot tone therein, detector means for detecting a level of pilot tone in said amplifier output and correction means for correcting said cancellation loop performance as a function of said detection wherein said pilot generator is further coupled to a multiplier receiving said amplifier output, said multiplier producing an output signal arranged to control a loop parameter to effect said correction. The distortion performance of a feed forward amplifier is thereby improved, alternatively an amplifier of inferior distortion performance, but potentially higher efficiency may be used.

8 Claims, 2 Drawing Sheets

AMPLIFIER HAVING FEED FORWARD CANCELLATION

The present invention relates to amplifiers and in particular to high power amplifiers wherein feed forward cancellation is employed, such as those used in radio-frequency (r.f.) applications.

In amplifier design, there is a trade off to be made between distortion performance and efficiency. Amplifiers which operate under so-called 'Class A' conditions have good distortion but low efficiency whereas an amplifier operated under class C conditions is reasonably efficient but introduces significant distortion. High efficiency and low distortion is the goal, but efficiency increasingly becomes a consideration at high power levels. For example, a typical cellular radio multi-carrier base station amplifier requirement would be 200 w average, 2 kw peak so clearly efficiency must be the best achievable if undue heat dissipation in the amplifier is to be avoided. Unfortunately, the common technique of negative feedback to correct distortion can only be considered for narrow band applications in r.f. high power amplifiers. For this reason many r.f. power amplifier operate in class A with the consequence heat dissipation tolerated.

As an alternative to class A operation, a more efficient class AB amplifier may be employed if feed-forward cancellation is applied. In this technique, the amplifier output (suitably scaled) is compared with the input signal to yield an error signal. The error signal is amplified and reintroduced to the output 180° out of phase with the original distortion, the distortion products being thereby cancelled in the final output. Feed forward can yield a 30 dB improvement in distortion performance but only if both the first comparison loop and the second correcting loop are accurately aligned. Generally the loop parameters do not remain constant over the full operating range of the amplifier and some dynamic correction is required, particularly in wideband application. For example, the error signal may be subject to amplitude and phase control prior to amplification. To provide the required control signals, a pilot tone may be injected into the amplifier input. The pilot signal (at residual distortion level) is detected at the output and used to provide control signals.

There are a number of problems to be solved with this approach. Firstly, there is successful detection of the low level pilot tone at the output. This demands good filtering at the receiver. Secondly there is the problem of deriving the control signals themselves. Systems which have been tried are an amplitude only arrangement, with long time constants aimed at correcting long term drift only, and iterative microprocessor controlled phase and amplitude systems, the basis of the control algorithm being to introduce an amplitude or phase change in the event of increased distortion and monitor the effect at the output for improvement, then loop until optimized. Unfortunately, this technique requires expensive filtering techniques at the receiver and a processor resource making it impractical and non-cost effective in most applications. Also, settling time is likely to be long.

In accordance with the present invention there is provided an amplifier arrangement to which feed forward cancellation is applied by a comparison loop including comparison means for comparing amplifier input with amplifier output to provide an error signal, a cancellation loop including secondary amplifier means for amplifying the error signal and combining means for combining said amplified error signal with said amplifier output, a pilot generator coupled to said amplifier input to introduce a pilot tone therein, detector means for detecting a level of pilot tone in said amplifier output and correction means for correcting said cancellation loop performance as a function of said detection wherein said pilot generator is further coupled to a multiplier receiving said amplifier output, said multiplier producing an output signal arranged to control a loop parameter to effect said correction.

Preferably the loop parameter is amplitude, or phase, or both.

Advantageously, an amplifier arrangement in accordance with the present invention includes a further multiplier, said further multiplier producing an output signal arranged to control a further loop parameter. Preferably there are provided means for controlling a parameter of the comparison loop, for example phase.

In order that features and advantages of the present invention may be further appreciated, embodiments will now be described, by way of example only, with reference to the accompanying diagrammatic drawings, of which:

Figure 1:
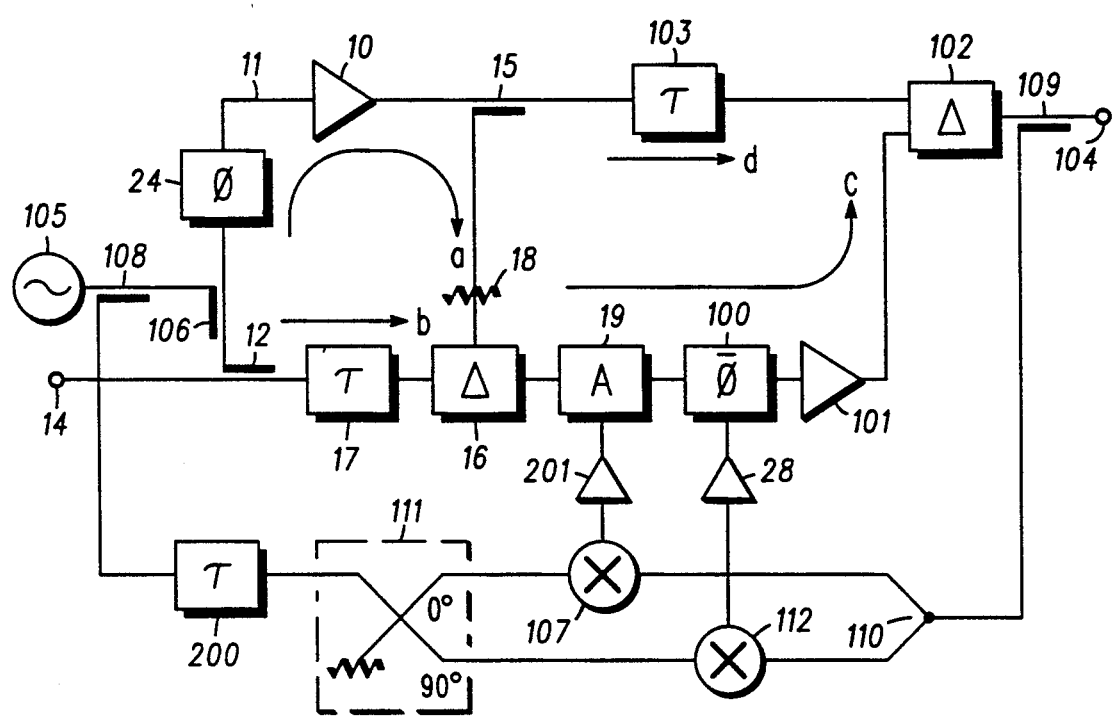
FIG. 1 represents an amplifier having feed forward cancellation in accordance with the present invention.

An r.f. high power amplifier 10 (FIG. 1) receives an input signal at its input 11 via a coupling 12 whenever a signal for amplification is applied to input port 14. The output of the amplifier 10 is tapped by a coupler 15 and fed to an input of a comparator 16, which may take the form of another directional coupler. The input signal applied at port 14 is fed to a second input of comparator 16 via a delay line 17, arranged to introduce a delay substantially equal to that of the power amplifier 10. Comparator 16 thus produces at its output an error signal representative of the difference between the input signal fed via amplified path a and delayed path b. The amplified path a includes an attenuator pad 18 to compensate for the signal gain introduced by the power amplifier 10. Paths a and b constitute the comparison loop of a feed forward arrangement. The error signal produced at the output of the comparator 16 is representative of distortion introduced by the power amplifier 10 and is fed via networks 19,100 to an error amplifier 101 and thence to an input of a combiner 102, which may take the form of a directional coupler. A second input of combiner 102 receives the output signal of the power amplifier 10 via a delay line 103 arranged to introduce a delay substantially equal to that introduced by comparator 16, networks 19 and 100 and error amplifier 101. Delay lines 17 and 103 may for example take the form of a length of coaxial cable transmission line. Combiner 102 serves to introduce the amplified error signal received via path c to the amplifier output signal received via path d such that the error signal is in antiphase with the distortion present in the signal received via path d. The resultant signal produced at output port 104 thus has had feed forward distortion cancellation applied; paths c and d constituting the cancellation loop of the feed forward arrangement.

An oscillator 105 is arranged to provide a pilot tone which is coupled into the power amplifier input 11 by a coupling 106. It should be noted that couplers 12 and 106 are arranged such that the oscillator signal is not coupled into input signal path b. This may be achieved by providing sufficient directivity from couplers 106 and 12. Since the pilot tone travels via path a only to comparator 16, it will contribute to the error signal and hence be cancelled by the cancellation loop. Thus the pilot tone will contribute distortion to the eventual output produced at port 104 that is no greater than the residual distortion that remains incorrected by the feedforward loops.

The oscillator feeds a first input of a multiplier 107 via a coupler 108, the second output of which is derived from the eventual output via a coupler 109. As will be apparent to those skilled in the art when there is amplitude mis-alignment the output of the multiplier provides a maximum output when the residual pilot tone is in phase with the input signal from the oscillator. In the general case where path 1 is not phase constant a phase network 24 is controlled in such a way that the path behaves as a constant phase path. When the loop is to be aligned, delay network 200 is adjusted for maximum output from mixer 107. This output of mixer 107 is fed as a control signal to network 19, being a controllable attenuator used to adjust the amplitude of the error signal output of comparator 16 prior to amplification by error signal amplifier 101. Thus it will be appreciated that amplitude errors in the cancellation loop resulting in uncancelled distortion may be corrected by this mechanism.

Suppose, for example that the gain of amplifier 101 is less than its nominal design value by −G. Correction network 19 must thus provide G less attenuation to maintain alignment. In the non-aligned condition, some portion of the pilot tone appears at output 104 and is thereby coupled to an input of mixer 107. The mis-alignment produces a response of magnitude E at the output of mixer 107 which is amplified by a control amplifier 201 to give a signal of magnitude $G_c.E$ driving network 19, where $G_c$ is the gain of control amplifier 201. The sign of $G_c$ has to be such that if E is produced by a lack of gain in amplifier 101, $G_c.E$ reduces the attenuation in network 19. It is desirable that a high gain amplifier 201 is provided.

In a way analogous to amplitude control network 19, network 100 is arranged to control the phase of the error signal applied to error amplifier 101. Network 100 is controlled by the output of multiplier 112 which receives the eventual output signal via a coupler 110 at its first input and a quadrature oscillator reference via 90° coupler 111. It will be appreciated that the output of multiplier 112 is representative of that component of the pilot tone present in the eventual output at 104 that is in quadrature with the oscillator signal; thus phase errors in the cancellation loop resulting in uncancelled distortion are corrected.

Figure 3:
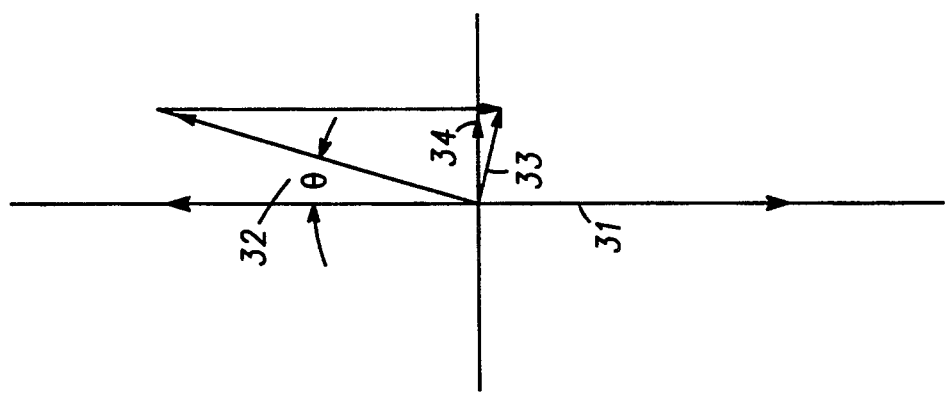
FIG. 3 represents a phasor diagram showing operation of the phase alignment loop.

For example, suppose there is amplitude alignment (phasors 31,32 of equal magnitude in FIG. 3), but there is a phase unbalance. The remaining signal at the output 104 due to the mis-alignment is represented by the phasor 33. Phasor 34 represents the quadrature component of the unbalance signal which may be used as a basis for cancellation since for small $\phi$, $/\sin \phi/$ (phasor 34) is approximately equal to $/\phi/$ (phasor 33, to be corrected).

Amplitude control network 19 may be a conventional PIN diode attenuator with dc control and phase control network 100 may take the form at a 90° coupler with a varicap diode controlled mismatched.

Advantages of the present invention will be apparent from the foregoing description, in particular control of the cancellation loop for minimum distortion allows better performance from the same power amplifier than with prior art feed forward techniques or alternatively an amplifier with a worse distortion performance (but better efficiency) may yield the same overall performance. For a typical high power r.f. amplifier delivering approximately 200 w average power (2 kw peak rated power amplifier, 200 w peak rated error amplifier) operating in the 900 MHz band a reduction of 30 dB in distortion products could be achieved. The pilot tone may be selected to be conveniently within the frequency range of interest, control being wideband based on this representative performance. Alternatively two or more pilot tones may be introduced at different points across the band of interest, each controlling narrow band networks to permit a yet improved cancellation loop control.

The performance of the arrangement described above may be improved by incorporation of a further feature of the invention, and such an embodiment will be described below. Continuing to consider the embodiment of FIG. 1, it will be noted that the amplitude applied to the mixers is preferably large, since the magnitude of the pilot tone is small (60 dB down on amplified signal). If a signal of too large an amplitude is mixed, however, inter-moduction occurs and the loop provides no correction. Hence the mixer input signals must be relatively low level, yielding a small dc output at the mixer for amplification by amplifier 201 to a level where control may be effected. Therefore the loop is dependant upon the mixer dc characteristics and it is generally the mixer dc stability that limits the overall performance of the loop.

Figure 2:
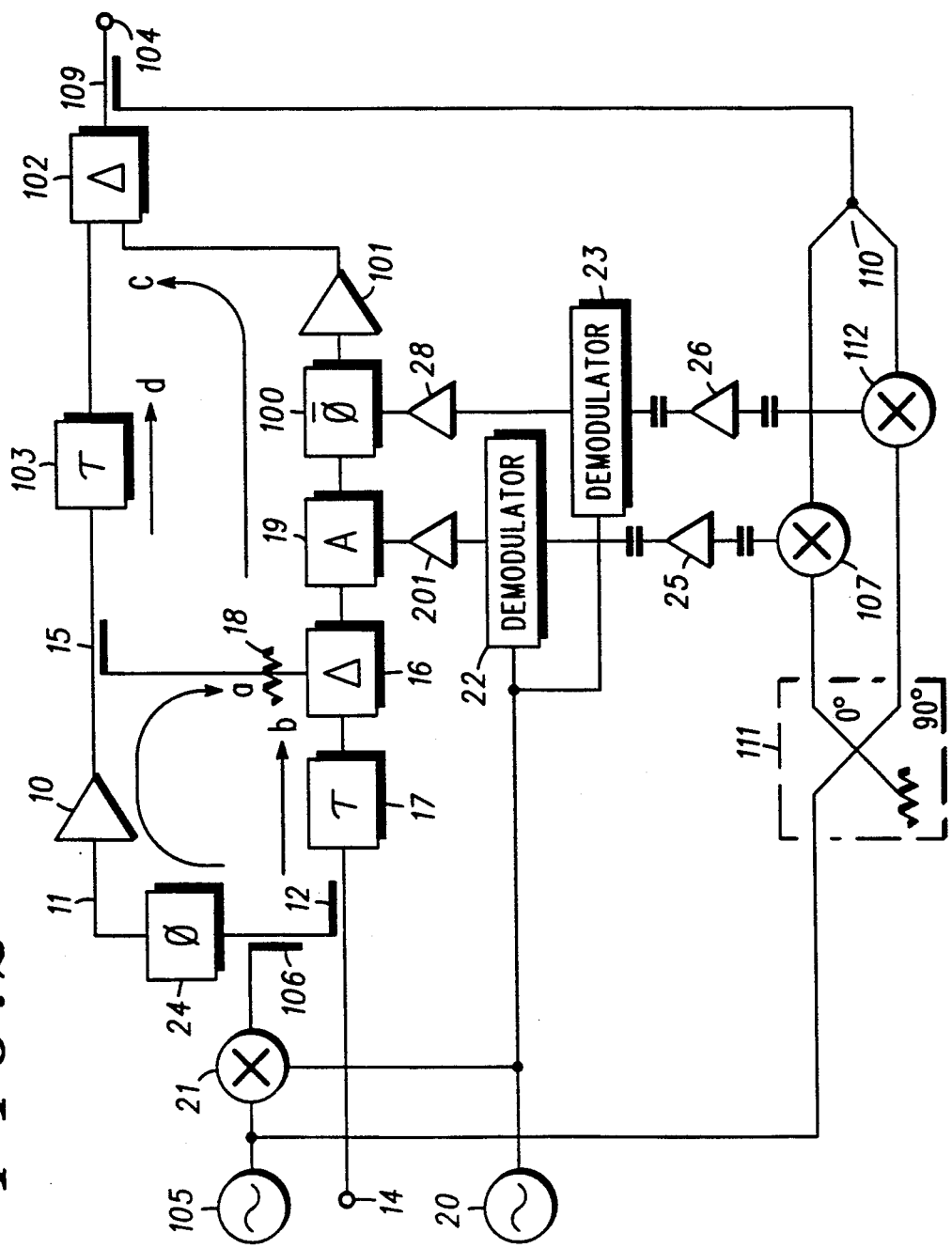
FIG. 2 represents an alternative embodiment of the present invention.

In further embodiment of the present invention (FIG. 2 in which reference numerals common with those of FIG. 1 have been used for functionally equivalent items) a low frequency oscillator 20 modulates the output of the pilot tone oscillator 105 via a mixer 21. Modulated outputs of mixers 107, 112 respectively representative of the in phase and quadrature components of the uncancelled pilot tone, are demodulated by envelope demodulators 22,23 respectively to yield dc control signals to control amplitude network 19 and phase network 100. It will be appreciated that modulation of the pilot tone means that ac outputs are available provided by multipliers 107 and 112 thus performance is not affected by multiplier dc offset or drift.

Essentially mixers 107, 112 function as synchronous detectors, the envelope output being amplified by ac coupled amplifiers 25, 26 respectively. Since amplification is ac, performance is not dependent upon the dc stability of the mixers. The envelope is detected by demodulators 22, 23, the dc outputs of which may be amplified by amplifiers 201, 28. The gain of these dc coupled amplifiers may be higher than the gain of the corresponding amplifiers in the arrangement since any drift or offset of the mixers is no longer coupled through. Hence the level of the pilot tone in the overall may be reduced. In addition to their principle purpose of amplification to overcome mixer dc offset and drift, the ac amplifier may be arranged to contribute to the overall loop gain a proportion of the control gain thus being provided by the ac amplifiers. The present embodiment is particularly suitable for wideband applications. In such applications it is important that the phase shift of the pilot tone on its passage through the system is not so great that the phase margin of the negative feedback arrangement is destroyed. In the present embodiment a phase control network 24 is provided in the comparison loop for this purpose.

In an example of the present embodiment for wideband operation a pilot tone at 900 MHz was modulated by a low-frequency generator operating at 1 KHz.

We claim:

1. An amplifier arrangement including an amplifier to which feed forward cancellation is applied, comprising:
    a comparison loop including comparison means for comparing an amplifier input signal with an amplifier output signal to provide an error signal,
    a cancellation loop including
        (i) secondary amplifier means for amplifying the error signal,
        (ii) combining means for combining said amplified error signal with said amplifier output signal, and
        (iii) correction means coupled between said secondary amplifying means and said combining means for correcting performance of said cancellation loop;
    a pilot generator coupled to said amplifier input to introduce a pilot tone thereat,
    detector means for detecting a level of said pilot tone in said amplifier output signal, said detector means including a first multiplier for receiving both said amplifier output signal and said pilot tone for providing a first output signal to said correction means to control a first loop parameter, said detector means including a second multiplier for receiving both said amplifier output signal and a phase shifted version of said pilot tone for providing a second output signal to said correction means to control a second loop parameter.

2. An amplifier arrangement as claimed in claim 1 and wherein said first loop parameter is amplitude.

3. An amplifier arrangement as claimed in claim 1 and wherein said second loop parameter is phase.

4. An amplifier arrangement as claimed in claim 1 and including means for controlling a parameter of the comparison loop.

5. An amplifier arrangement as claimed in claim 4 and wherein said loop parameter is phase.

6. An amplifier arrangement as claimed in any one of the preceding claims and including means for modulating the pilot tone and means for demodulating said first and second output signals of said first and second multipliers.

7. An amplifier arrangement as claimed in claim 6 and including an AC amplifier coupled between the first and second multipliers and the demodulating means.

8. An amplifier arrangement as claimed in claim 6 and including a DC amplifier coupled between the demodulating means and said correction means.

* * * * *